United States Patent [19]

Doi et al.

[11] Patent Number: 5,465,341
[45] Date of Patent: Nov. 7, 1995

[54] VERIFIABLE SECURITY CIRCUITRY FOR PREVENTING UNAUTHORIZED ACCESS TO PROGRAMMED READ ONLY MEMORY

[75] Inventors: Bryan C. Doi, Fremont; Steven D. Thomas, Palm Dale; Vincent J. Coli, San Jose; Vito D. Giglio, Canoga Park, all of Calif.

[73] Assignee: VLSI Technology, Inc., San Jose, Calif.

[21] Appl. No.: 965,635

[22] Filed: Oct. 23, 1992

[51] Int. Cl.$^6$ ...................................................... G06F 12/14
[52] U.S. Cl. ................. 395/183.06; 364/969; 364/969.4; 364/965.76; 364/918.7; 364/DIG. 2; 365/201; 395/106; 395/490
[58] Field of Search ............................. 395/425; 365/228, 365/201; 364/200 MS File, 900 MS File, 244.6, 249.2, 286.4, 918.7, 949, 949.96, 965.76, 965.79, 969, 969.4

[56] References Cited

U.S. PATENT DOCUMENTS

| | | | |
|---|---|---|---|
| 4,480,318 | 10/1984 | Chong | 365/104 |
| 4,503,387 | 3/1985 | Rutledge et al. | 324/73 |
| 4,590,552 | 5/1986 | Guttag et al. | 364/200 |
| 4,719,599 | 1/1988 | Natsut et al. | 365/201 |
| 4,731,760 | 3/1988 | Maini | 365/201 |
| 4,972,372 | 11/1990 | Ueno | 365/201 |
| 4,974,208 | 11/1990 | Nakamura et al. | 365/228 |
| 5,175,840 | 12/1992 | Sawase et al. | 395/425 |
| 5,293,610 | 3/1994 | Schwarz | 395/425 |
| 5,315,553 | 5/1994 | Morris | 365/201 |

FOREIGN PATENT DOCUMENTS

| | | |
|---|---|---|
| 0231041 | 8/1987 | European Pat. Off. . |
| 0378306 | 7/1990 | European Pat. Off. . |

OTHER PUBLICATIONS

L. Phillipson, et al., *A Communication Structure for a Multiprocessor Computer with Distributed Global Memory*, Proc. 10th Annual Intl. Conf. on Computer Architecture, 1983, Stockholm, SE, pp. 334–339.

*Primary Examiner*—Rebecca L. Rudolph
*Assistant Examiner*—Frank J. Asta
*Attorney, Agent, or Firm*—Douglas L. Weller

[57] ABSTRACT

A security system is used for programmable read-only memory locations within a very large scale integrated (VLSI) circuit. In a first security bit memory location there is stored a first security data bit. The first security data bit has a first value when the first security bit memory location is unprogrammed and a second value when the first security bit memory location is programmed. In a second security bit memory location there is stored a second security data bit. The second security data bit has the first value when the second security bit memory location is unprogrammed and the second value when the second security bit memory location is programmed. A selection logic is electrically coupled to the first security bit memory location and the second security bit memory location. The selection logic selects no security data bit, the first security data bit or the second security data bit to be used to generate a security access signal. An access logic allows and prevents direct access, by any device outside the VLSI circuit, to the programmable read-only memory locations in response to the security access signal. The access logic prevents any device outside the VLSI circuit direct access to the programmable read-only memory locations when the selection logic selects no security data bit, when the selection logic selects the first security bit and the first security data bit has the second value, or when the selection logic selects the second security bit and the second security data bit has the second value.

10 Claims, 4 Drawing Sheets

5,465,341

VERIFIABLE SECURITY CIRCUITRY FOR PREVENTING UNAUTHORIZED ACCESS TO PROGRAMMED READ ONLY MEMORY

BACKGROUND

The present invention concerns the provision of a method and circuitry to protect a programmable read-only memory (PROM) or programmable logic array within an integrated circuit from unauthorized access.

Once a PROM or programmable array of logic within a very large scale integrated (VLSI) circuit has been programmed and verified, it is often desirable to prevent further access by other than logic internal to the VLSI circuit. The restriction of access may be, for example, to prevent further programming of the PROM or to prevent examination of the contents of the PROM.

In the prior art, the burning of a security fuse has been used after programming a programmable array of logic (PAL) to prevent further programming. However, the use of such a security fuse could cause difficulty when applied to a PROM within an integrated circuit. Particularly, in the prior art, there is no way for a manufacture to test the integrity of the security which implements the security fuse prior to use by a user. The inability to test the security logic would, if the security logic were utilized in a PROM, result in a manufacturer being required to develop a very reliable manufacturing process in order to guarantee the shipment of a high yield of working products.

SUMMARY OF THE INVENTION

In accordance with the preferred embodiment of the present invention, a security system for programmable read-only memory locations within a VLSI circuit is presented. In a first security bit memory location there is stored a first security data bit. The first security data bit has a first value when the first security bit memory location is unprogrammed and a second value when the first security bit memory location is programmed. In a second security bit memory location there is stored a second security data bit. The second security data bit has the first value when the second security bit memory location is unprogrammed and the second value when the second security bit memory location is programmed. A selection logic is electrically coupled to the first security bit memory location and the second security bit memory location. The selection logic selects no security data bit, the first security data bit or the second security data bit to be used to generate a security access signal. An access logic allows and prevents direct access, by any device outside the VLSI circuit, to the programmable read-only memory locations in response to the security access signal. The access logic prevents any device outside the VLSI circuit direct access to the programmable read-only memory locations when the selection logic selects no security data bit, when the selection logic selects the first security bit and the first security data bit has the second value, or when the selection logic selects the second security bit and the second security data bit has the second value.

In the preferred embodiment of the present invention, the VLSI circuit includes additional logic circuitry. Additionally, the selection logic includes a first multiplexor which selects between data on address lines from the additional logic circuitry and data on input pins of the VLSI circuit to be connected to input address lines for the programmable read only memory locations. The selection logic additionally includes a second multiplexor which selects between data lines for the additional logic circuitry and output pins of the VLSI circuit to receive data from the programmable read only memory locations.

Also in the preferred embodiment of the present invention, the additional logic circuitry generates a test bit. Additionally, the access logic does not allow any device outside the VLSI circuit direct access to the programmable read-only memory locations when the test bit has the second value.

In one embodiment of the security system, the programmable read-only memory locations are arranged in a memory array within a PROM. The PROM additionally includes an address decoder, a test row, a test column, the first security bit memory location and the second security bit memory location. Also, the VLSI circuit may additionally include program logic which provides a programming voltage to the programmable read-only memory locations. The program logic includes an enable/disable logic for preventing programming when the selection, logic selects no security data bit, when the selection logic selects the first security bit and the first security data bit has the second value, or when the selection logic selects the second security bit and the second security data bit has the second value.

The security system has the advantage of being testable. For example, once the test memory locations have been programmed, the first security memory bit may be programmed. Once the first security memory bit is programmed, the first security memory bit is selected and it is verified that no device outside the VLSI circuit can access the programmable read-only memory locations. The end user then can program and protect the programmable read-only memory locations by first selecting the second security memory bit. Then, the programmable read-only memory locations may be programmed. Afterwards, the second security memory bit is programmed, thereby preventing subsequent unauthorized access to the programmable read-only memory locations.

DESCRIPTION OF THE PREFERRED EMBODIMENT

Figure 1:
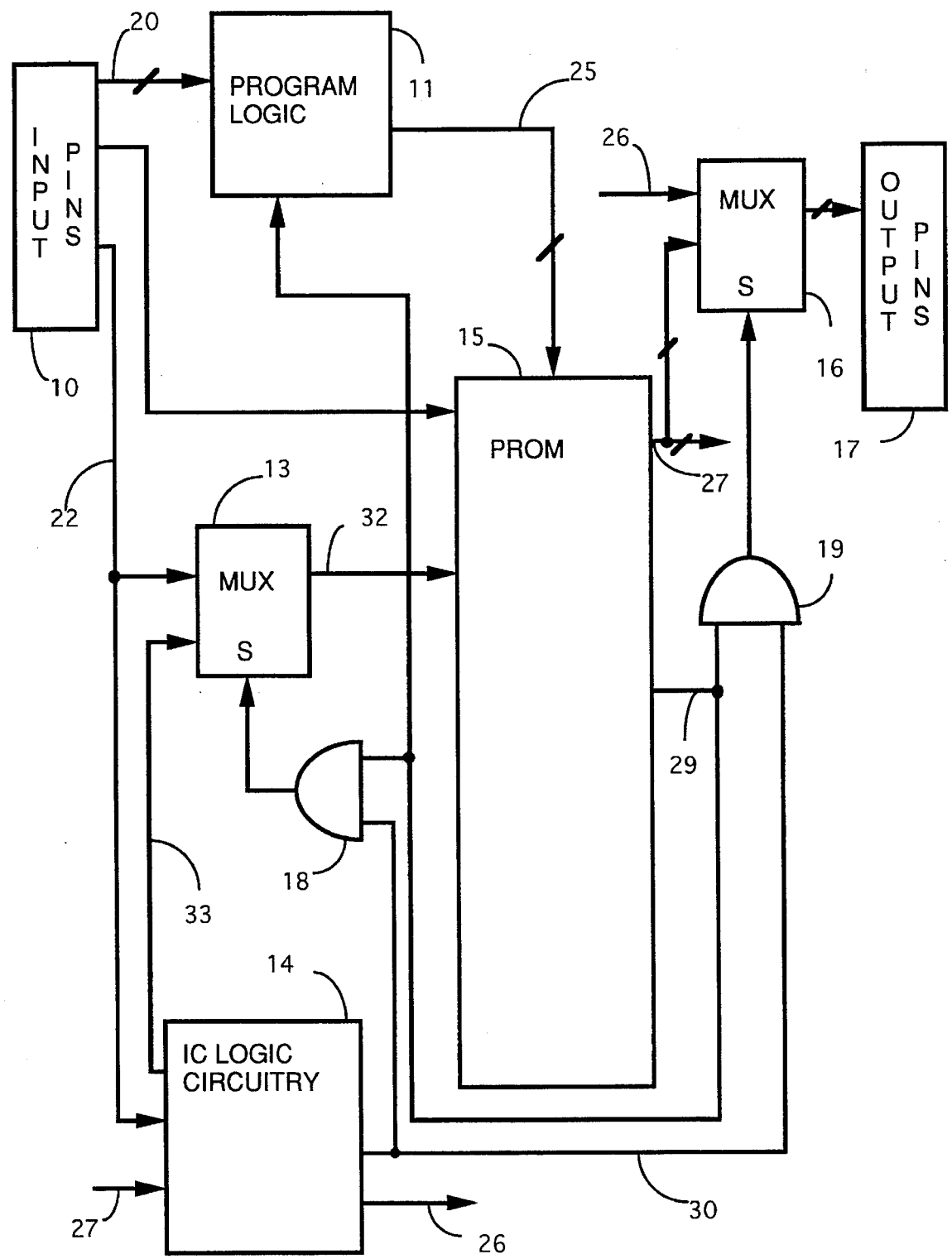
FIG. 1 shows implementation of security logic in an integrated circuit, in accordance with the preferred embodiment of the present invention.

FIG. 1 shows a block diagram of circuitry which implements security for a programmable read only memory (PROM) 15 which is within a VLSI circuit. Integrated circuit (IC) logic circuitry 14 within the VLSI circuit controls operation of the VLSI circuit. Under normal operating conditions, when PROM 15 is accessed, a multiplexor 13 selects an address on lines 33 to be forwarded to PROM 15 on address lines 32. In response, IC logic circuitry 14 receives data from PROM 15 through PROM output lines

27.

Also, under normal operating conditions, IC logic circuitry 14 controls the interface of the VLSI circuit to other devices. IC logic circuitry 14 receives data through input pins 10 via lines 22. A multiplexor 16 selects data on logic output lines 26 to be connected to output pins 17.

When PROM 15 is programmed and verified, multiplexor 13 selects an address on lines 22 from input pins 10 to be forwarded to PROM 15 on address lines 32. Multiplexor 16 selects data on PROM output lines 27 to be connected to output pins 17. In response to values placed on input pins 10 and forwarded to program logic 11 through lines 20, program logic 11 provides programming voltages to PROM 15 through lines 25.

A selection input to multiplexor 13 and a selection input to multiplexor 16 are controlled respectively by a logical AND gate 18 and a logical AND gate 19. Alternately, as will be understood by persons of ordinary skill in the art, the function of logical AND gate 18 and logical AND gate 19 may be accomplished by a single logical AND gate. Logical AND gate 18 and logical AND gate 19 each performs a logical AND operation on a test/program bit and a security bit. The test/program bit is generated by IC logic circuitry 14 and placed on a line 30. The security bit is supplied by PROM 15 and placed on a line 29. Program logic 11 also receives the security bit on line 29 which serves to enable/disable program logic 11.

In the circuitry shown in FIG. 1, when both the test/program bit and the security bit are at logic 1, multiplexor 13 selects an address on lines 22 to be connected to address lines 32 and multiplexor 16 selects data on PROM output lines 27 to be connected to output pins 17. Therefore, memory locations within PROM 15 may be programmed and accessed by devices outside the VLSI circuit. When either the test/program bit or the security bit is at logic 0, multiplexor 13 selects the address on lines 33 to be connected to address lines 32 and multiplexor 16 selects the data on logic output lines 26 to be connected to output pins 17. Therefore, memory locations within PROM 15 cannot be programmed or accessed by devices outside the VLSI circuit.

As may be understood by a person of ordinary skill in the art, while the logic shown assumes the security bit and the test/program bit are active high, the logic shown may be easily modified to accommodate the situation where the security bit and/or the test/program bit are active low.

In the preferred embodiment of the present invention, two locations within PROM 15 are able to provide the security bit on line 29. Security bit address lines 21 are used to access the first security bit, the second security bit or no security bit.

Figure 2:
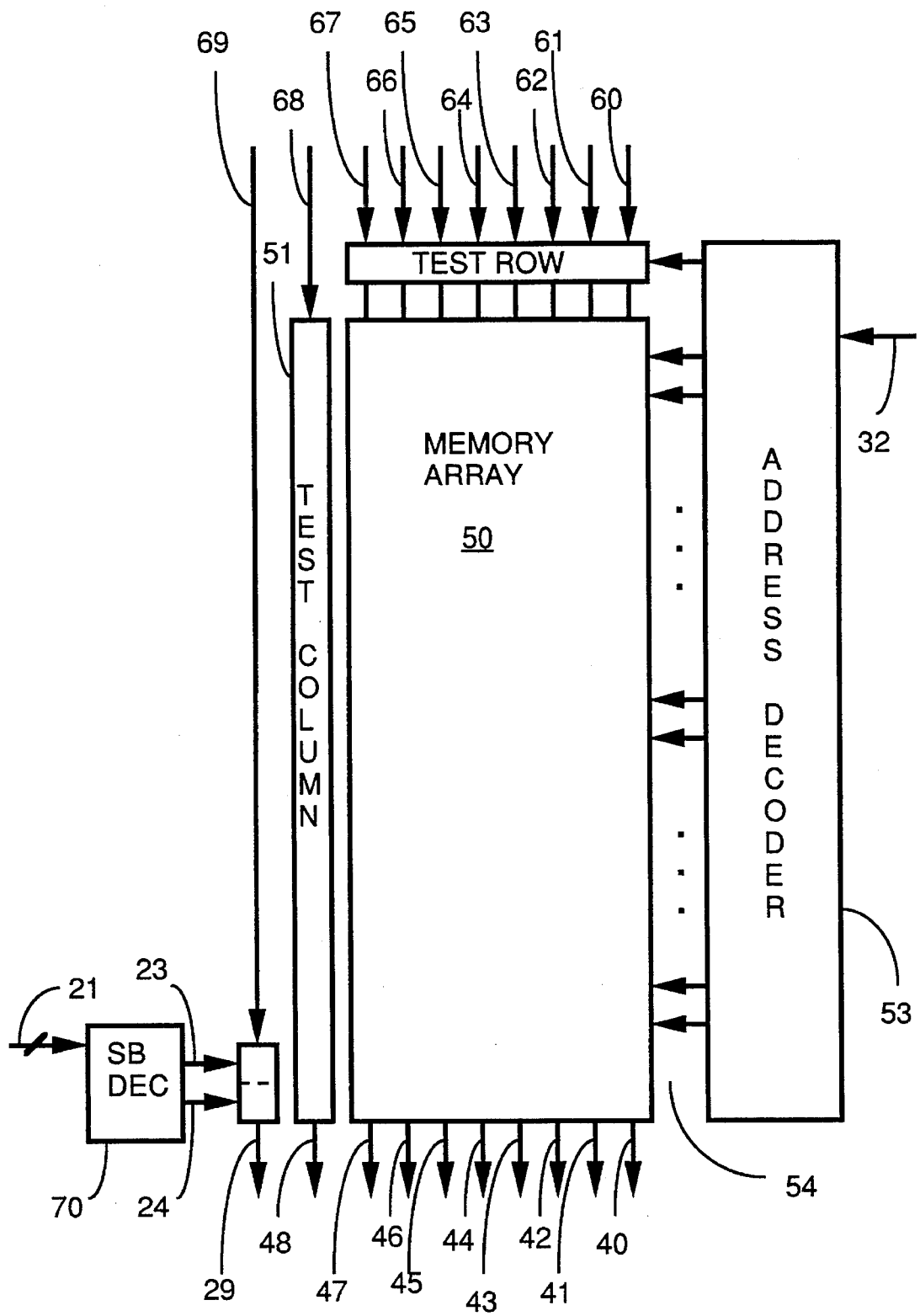
FIG. 2 shows the arrangement of a testable programmable read only memory in accordance with the preferred embodiment of the present invention.

FIG. 2 shows a simplified block diagram of PROM 15. Memory array 50 contains, for example, 64 rows of 8 one-bit memory locations. An address decoder 53 receives an address on address lines 32 and generates a row select activating a selected row. In normal operation, data values stored by the selected row appear on data lines 40, 41, 42, 43, 44, 45, 46 and 47. This data is then forwarded to PROM output lines 27. When memory location in memory array 50 are being programmed, address decoder 53 receives an address on address lines 32 and generates a row select activating a selected row. A programming voltage through lines 25 is placed on various of programming lines 60, 61, 62, 63, 64, 65, 66 and 67. A programming voltage on one of the programming lines results in the corresponding memory cell in the selected row being programmed. In one embodiment of the present invention, unprogrammed memory cells store a data value of logic 1 and programmed memory cells store a data value of logic 0. In an alternate embodiment of the present invention, unprogrammed memory cells store a data value of logic 0 and programmed memory cells store a data value of logic 1.

In order to aid in the factory test of the VLSI circuit, PROM 15 may include a test row 52 and a test column 51. In a test mode, the integrity of programming lines 60, 61, 62, 63, 64, 65, 66 and 67 and data lines 40, 41, 42, 43, 44, 45, 46 and 47 may be checked by programming and verifying values in test row 52. Likewise, the operation of address decoder 53 may be checked by programming and verifying values in test column 51. Test column 51 is programmed using a programming line 68. For more complete testing, an additional test row may be placed below memory array 50.

In the preferred embodiment of the present invention, two memory cells within PROM 15 are used to store security bits. One or none of the security bit locations are selected by a security bit decoder 70, based on a value on security bit address lines 21. When a first memory location is selected, security bit decoder activates a security bit selection line 23. When a second memory location is selected, security bit decoder activates a security bit selection line 24. The value in the selected memory location appears on line 29. The selected memory bit location may also be programmed using a programming line 69. In the disclosed embodiment of the present invention, when unprogrammed, each security bit memory cell stores a data value of logic 1. When programmed, each security bit memory cell stores a data value of logic 0. In an alternate embodiment of the present invention, when unprogrammed, each security bit memory cell stores a data value of logic 0. When programmed, each security bit memory cell stores a data value of logic 1. The actual position of the security bit memory location within PROM 15 should be concealed as well as possible to prevent defeat of the security feature by an unauthorized person.

Figure 3:
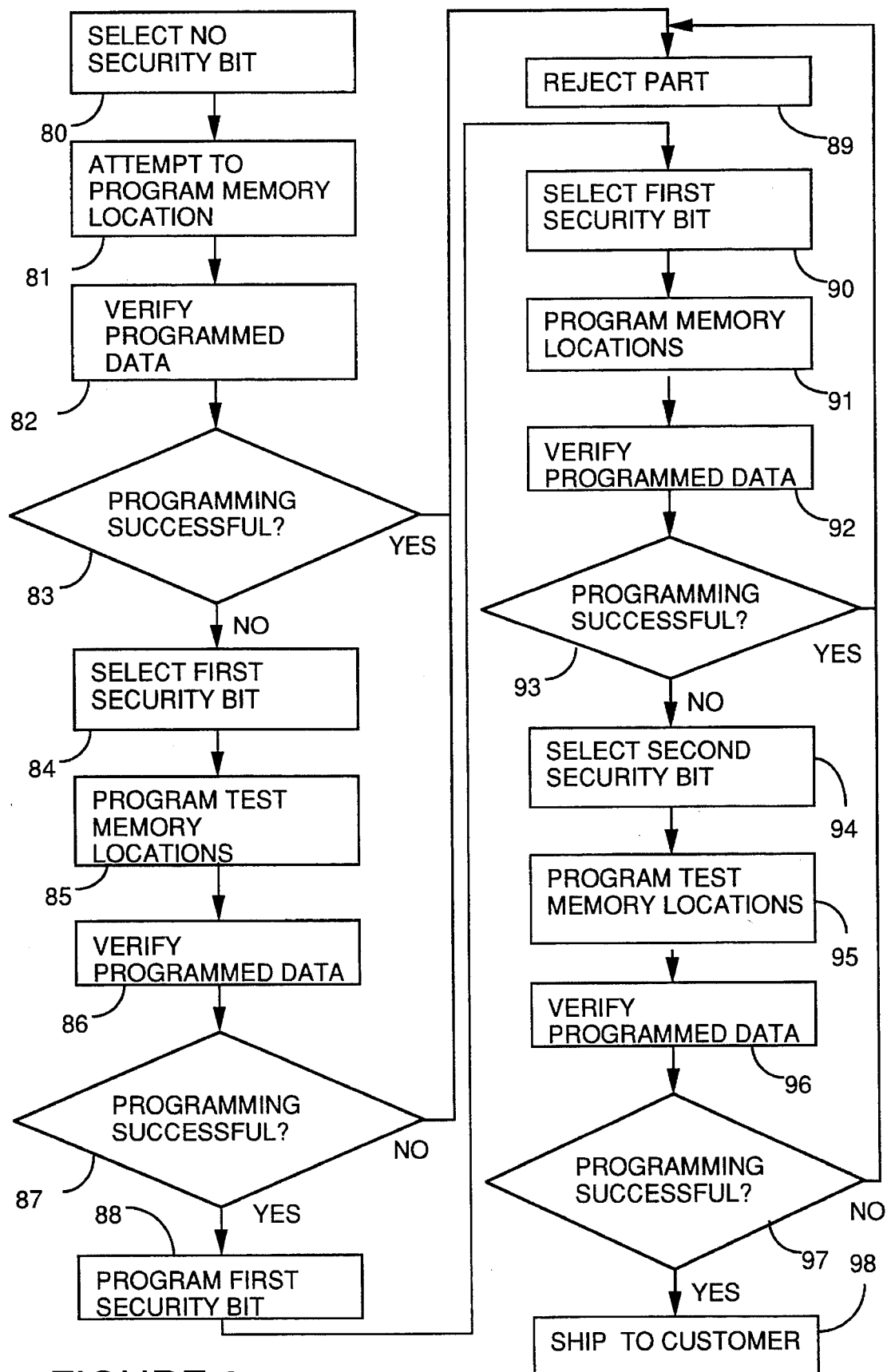
FIG. 3 is a flowchart which describes a process for testing the security feature of a VLSI circuit in accordance with a preferred embodiment of the present invention.

The use of two separate memory locations for the security bit allows for the manufacturer to test the security features of the VLSI circuit. For example, FIG. 3 is a flowchart which describes a process for testing the security feature of a VLSI circuit by a device external to the VLSI circuit in accordance with a preferred embodiment of the present invention. During testing, IC logic circuitry 14 sets the test/program bit on line 30 to logic 1.

In a step 80, no security bit is selected by the address on security bit address lines 21. In a step 81, an attempt is made to access and program memory locations within memory array 50. In a step 82, the first security bit is selected and program memory locations are checked to see if any were programmed or accessed in step 81.

A step 83 is a branching step. If any memory locations were successfully programmed, in a step 89 the VLSI circuit is rejected. Otherwise, in a step 84, the first security bit location is selected by the address on security bit address lines 21. In a step 85, an attempt is made to access and program memory locations within the test row(s) and/or test column(s). In a step 86, the programmed memory locations are checked to see if they were successfully programmed in step 85.

A step 87 is a branching step. If any memory locations were not successfully programmed, in step 89 the VLSI circuit is rejected. Otherwise, in a step 88, the first security bit is programmed. In a step 90, the first security bit location is selected by the address on security bit address lines 21. In a step 91, an attempt is made to access and program memory locations within memory array 50. In a step 92, the second security bit is selected and program memory locations are checked to see if any were programmed or accessed in step 91.

A step 93 is a branching step. If any memory locations were successfully programmed, in step 89 the VLSI circuit is rejected. Otherwise, in a step 94, the second security bit location is selected by the address on security bit address lines 21. In a step 95, an attempt is made to access and program memory locations within memory array 50. In a step 96, program memory locations are checked to see if any were programmed or accessed in step 95.

A step 97 is a branching step. If any memory locations were not successfully programmed, in step 89 the VLSI circuit is rejected. Otherwise, in a step 98, after all other testing is complete, the VLSI circuit may be shipped to the customer.

Figure 4:
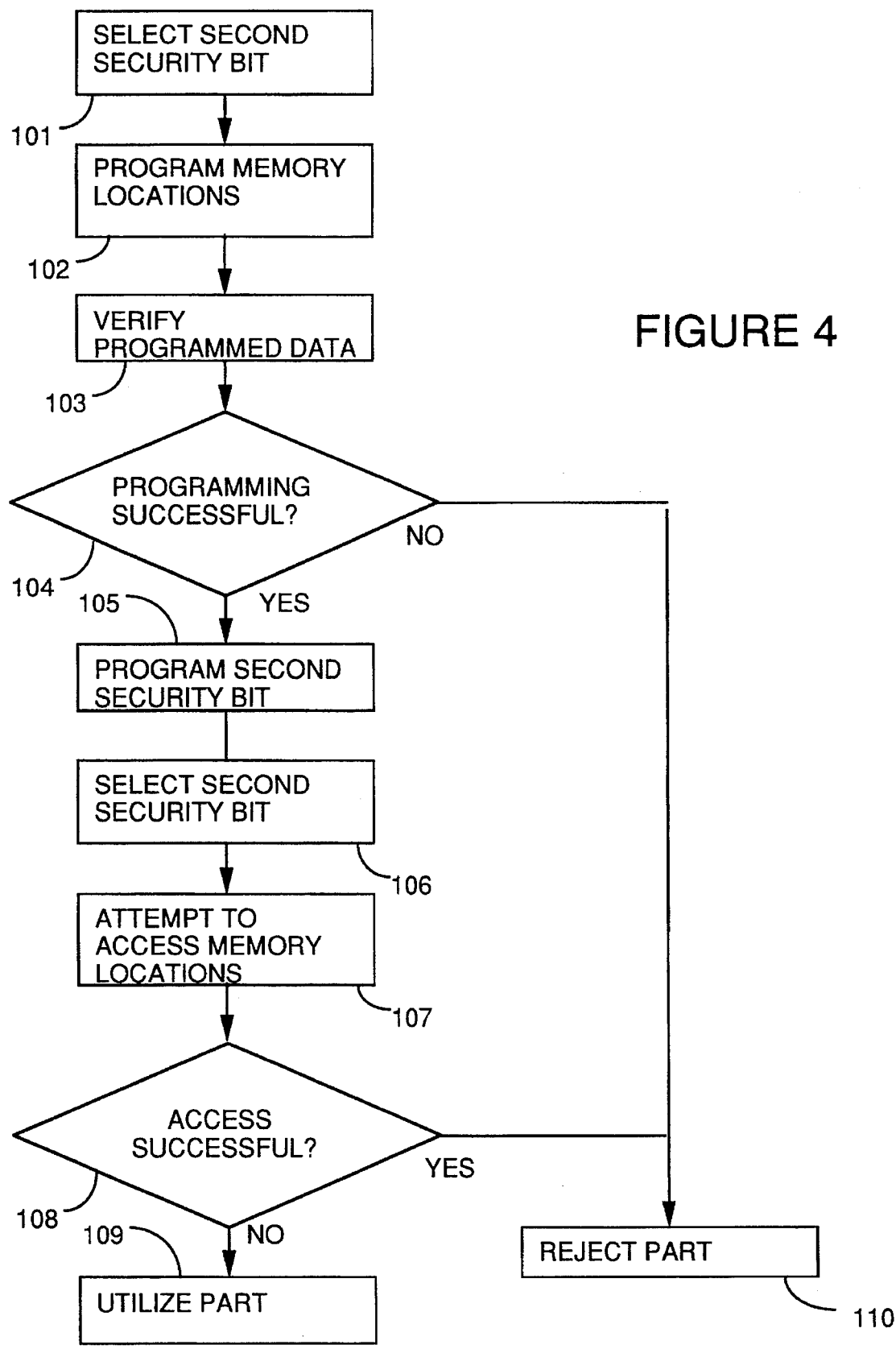
FIG. 4 is a flowchart which describes a process which a customer follows to program and test a part in accordance with a preferred embodiment of the present invention.

FIG. 4 describes a process by which a customer programs and tests the shipped part. In a step 101, the customer selects the second security bit. In a step 102, the customer programs memory locations within memory array 50. In a step 103, the customer verifies the programmed data.

A step 104 is a branching step. If any memory locations were not successfully programmed, in a step 110, the VLSI circuit is rejected. Otherwise, in a step 105, the second security bit is programmed. In a step 106, the second security bit is selected. In a step 107, an attempt is made to access memory locations within memory array 50.

A step 108 is a branching step. If any memory locations were successfully accessed, in step 110, the VLSI circuit is rejected. Otherwise, in a step 109, the VLSI circuit is ready for further testing or to be utilized in a computing system.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A security system for programmable read-only memory locations within a very large scale integrated (VLSI) circuit, the security system comprising:

a first security bit memory location in which is stored a first security data bit, the first security data bit having a first value when the first security bit memory location is unprogrammed and the first security data bit having a second value when the first security bit memory location is programmed;

a second security bit memory location in which is stored a second security data bit, the second security data bit having the first value when the second security bit memory location is unprogrammed and the second security data bit having the second value when the second security bit memory location is programmed;

selection means, electrically coupled to the first security bit memory location and the second security bit memory location, for selecting to provide a value for a security access signal, one of the first security data bit, the second security data bit or neither the first security data bit nor the second security data bit; and, access means, coupled to the selection means, for allowing and preventing direct access, by any device outside the VLSI circuit, to the programmable read-only memory locations in response to the security access signal;

wherein the access means prevents any device outside the VLSI circuit direct access to the programmable read-only memory locations when the selection means selects neither the first security data bit nor the second security data bit, when the selection means selects the first security data bit and the first security data bit has the second value, or when the selection means selects the second security data bit and the second security data bit has the second value.

2. A security system as in claim 1 wherein the VLSI circuit includes input pins, output pins and additional logic circuitry, the additional logic circuitry having address lines and data lines and the additional logic circuit controlling operation of the VLSI circuit; and, wherein the access means includes a first multiplexor, coupled to the input pins and the address lines of the additional circuitry, the first multiplexor selecting between an address on the address lines of the additional logic circuitry and information on the input pins of the VLSI circuit to be connected to input address lines for the programmable read only memory locations, and a second multiplexor, coupled to the output pins, the programmable read-only memory locations and the data lines for the additional logic circuitry, the second multiplexor selecting between the data lines for the additional logic circuitry and data from the programmable read only memory locations to be placed on the output pins of the VLSI circuit.

3. A security system as in claim 2 wherein the additional logic circuitry generates a test bit and wherein the access means includes means, coupled to the additional logic circuitry, for preventing any device outside the VLSI circuit from having direct access to the programmable read-only memory locations when the test bit has a first test bit value.

4. A security system as in claim 1 wherein the programmable read-only memory locations are arranged in a memory array within a programmable read-only memory (PROM), the PROM additionally including an address decoder, coupled to the programmable read-only memory locations, and wherein the programmable read-only memory locations include programmable read only memory locations which form a test row, a test column, the first security bit memory location and the second security bit memory location.

5. A security system as in claim 1 wherein the VLSI circuit additionally includes program logic, coupled to the programmable read-only memory locations, for providing a programming voltage to the programmable read-only memory locations, the program logic including enable/disable means, coupled to the selection means, for preventing the program logic from programming the programmable read-only memory locations when the selection means selects neither the first security data bit nor the second security data bit, when the selection means selects the first security data bit and the first security data bit has the second value, or when the selection means selects the second security data bit and the second security data bit has the second value.

6. A method for providing security for programmable read-only memory locations within a VLSI circuit, the VLSI circuit including a first security bit and a second security bit, wherein providing security for programmable read-only memory locations includes verification of correct operation of security features, the method comprising the steps of:

(a) preventing, by the VLSI circuit, a device outside the VLSI circuit from accessing the programmable read-only memory locations except when the first security bit is selected and unprogrammed or when the second security bit is selected and unprogrammed;

(b) programming test memory locations within the VLSI circuit;

(c) programming the first security bit to a first value;

(d) selecting the first security bit; and (e) while the first security bit is selected, verifying that no device outside the VLSI circuit can access the programmable read-only memory locations.

7. A method as in claim 6 additionally comprising the steps of:

(f) selecting the second security bit;

(g) programming the programmable read-only memory locations; and, (h) programming the second security bit to the first value.

8. A method for providing security for programmable read-only memory locations within a VLSI circuit, the method comprising the steps of:

(a) providing within the VLSI circuit a first security bit memory location in which is stored a first security data bit, the first security data bit having a first value when the first security bit memory location is unprogrammed and the first security data bit having a second value when the first security bit memory location is programmed;

(b) providing within the VLSI circuit a second security bit memory location in which is stored a second security data bit, the second security data bit having the first value when the second security bit memory location is unprogrammed and the second security data bit having the second value when the second security bit memory location is programmed; and, (c) preventing, by the VLSI circuit, any device outside the VLSI circuit from directly accessing the programmable read-only memory locations when a selection means selects neither the first security data bit nor the second security data bit, when the selection means selects the first security data bit and the first security data bit has the second value, or when the selection means selects the second security data bit and the second security data bit has the second value.

9. A method as in claim 8 additionally comprising the step of:

(d) preventing, by the VLSI circuit, any device outside the VLSI circuit from directly accessing the programmable read-only memory locations when a test bit, within the VLSI circuit, has a first test bit value.

10. A method as in claim 8 additionally comprising the step of:

(d) preventing a programming voltage from being provided to the programmable read-only memory locations when the selection means selects no security data bit, when the selection means selects the first security data bit and the first security data bit has the second value, or when the selection means selects the second security data bit and the second security data bit has the second value.

* * * * *